(12) United States Patent
Philipp et al.

(10) Patent No.: US 6,599,679 B2
(45) Date of Patent: Jul. 29, 2003

(54) PHOTOSENSITIVE FLEXOGRAPHIC PRINTING ELEMENT HAVING AN IR-ABLATIVE LAYER COMPRISING POLYETHER-POLYURETHANES

(75) Inventors: Sabine Philipp, Mörfelden-Walldorf (DE); Jürgen Kaczun, Niederkirchen (DE)

(73) Assignee: BASF Drucksysteme GmbH, Stuttgart (DE)

( * ) Notice: Subject to any disclaimer, the term of this patent is extended or adjusted under 35 U.S.C. 154(b) by 36 days.

(21) Appl. No.: 09/998,223

(22) Filed: Dec. 3, 2001

(65) Prior Publication Data

US 2002/0110751 A1 Aug. 15, 2002

(30) Foreign Application Priority Data

Dec. 7, 2000 (DE) .......................... 100 61 114

(51) Int. Cl.[7] ................................. G03F 7/00

(52) U.S. Cl. .................... 430/273.1; 430/306; 430/944; 430/945; 101/395; 101/453; 101/463.1

(58) Field of Search ...................... 430/5, 273.1, 281.1, 430/286.1, 306, 348, 944, 945, 964; 101/395, 453, 463.1

(56) References Cited

U.S. PATENT DOCUMENTS

| 5,719,009 | A | * | 2/1998 | Fan | .............. | 430/306 |
| 6,037,102 | A | | 3/2000 | Loerzer et al. | .............. | 430/306 |
| 6,238,837 | B1 | * | 5/2001 | Fan | .......................... | 430/273.1 |
| 6,521,390 | B1 | * | 2/2003 | Leinenbach et al. | ...... | 430/273.1 |
| 2002/0009672 | A1 | * | 1/2002 | Daems et al. | ............ | 430/273.1 |
| 2002/0034707 | A1 | * | 3/2002 | Bennett et al. | .......... | 430/273.1 |
| 2002/0115019 | A1 | * | 8/2002 | Kaczun et al. | ........... | 430/273.1 |

FOREIGN PATENT DOCUMENTS

| EP | 0 741 330 A1 | | 11/1996 | | |
| EP | 0 767 407 A1 | | 4/1997 | | |
| EP | 1 069 475 A1 | * | 1/2001 | ............. | G03F/1/00 |
| JP | 2001-80225 A | * | 3/2001 | ............. | B41N/1/12 |
| JP | 2002-214763 A | * | 7/2002 | ............. | G03F/7/36 |
| WO | WO 94/03838 | | 2/1994 | | |
| WO | WO 97/25206 | | 7/1997 | | |

\* cited by examiner

Primary Examiner—Janet Baxter
Assistant Examiner—Barbara Gilliam
(74) Attorney, Agent, or Firm—Keil & Weinkauf

(57) ABSTRACT

A photosensitive flexographic printing element for the production of flexographic printing plates by digital imaging by means of lasers which has an IR-ablative layer with a polyether-polyurethane as binder. A process for the production of flexographic printing plates using an element of this type.

10 Claims, No Drawings

PHOTOSENSITIVE FLEXOGRAPHIC PRINTING ELEMENT HAVING AN IR-ABLATIVE LAYER COMPRISING POLYETHER-POLYURETHANES

The present invention relates to a photosensitive flexographic printing element for the production of flexographic printing plates by digital imaging by means of lasers which has an IR-ablative layer comprising a polyether-polyurethane as binder. The invention furthermore relates to a process for the production of flexographic printing plates using an element of this type.

The conventional method for the production of flexographic printing plates by laying a photographic mask on a photopolymeric recording element, irradiating the recording element with actinic light through this mask and washing out the unpolymerized areas of the exposed element with a developer liquid is increasingly being replaced by CtP (computer-to-plate) technology, frequently also known as digital imaging. In CtP methods, the photographic mask in conventional systems is replaced by the masks integrated into the recording element.

Although a number of different methods have been proposed, only two have hitherto achieved significant importance in the market. In the first method, the photopolymerizable element is provided with a suitable ink receptor layer, and a mask is printed on by means of an ink-jet printer, as disclosed, for example, in WO 97/25206. The element can subsequently be exposed and developed in a known manner.

In the second method, the photopolymerizable element is coated with a substantially opaque, IR-ablative layer. Layers of this type usually comprise carbon black. Imagewise irradiation by means of a laser removes the IR-ablative layer at the points where it is hit by the laser beam, and the underlying photopolymerizable layer is uncovered. The image recording element can then be irradiated over its full area with actinic light through the ablatively formed mask in a known manner and washed out using a developer liquid. In the washing-out step, the nonablated residues of the IR-ablative layer and the underlying unpolymerized areas of the exposed element are removed.

Flexographic printing elements having IR-ablative layers are known in principle. EP-A 654 150 discloses a flexographic printing element having an IR-ablative layer. The IR-ablative layer comprises an IR-absorbent material. In addition, polymeric binders and a large number of different auxiliaries, for example dispersion aids or plasticizers, are disclosed as optional constituents. Furthermore, an additional barrier layer between the photopolymerizable layer and the IR-ablative layer is disclosed. This is intended to prevent diffusion of monomers from the photopolymerizable layer into the IR-ablative layer.

EP-A 741 330 discloses an IR-ablative flexographic printing element which has no barrier layer of this type. A multiplicity of widely differing polymers is disclosed as binders for the IR-ablative layer. Furthermore, the IR-ablative layer may also comprise a second binder in a smaller amount, for which a multiplicity of widely varying polymers is likewise disclosed.

EP-A 767 407 discloses a flexographic printing element having an IR-ablative layer which has an elastomeric, film-forming binder. Binders disclosed are polyamides and polyvinyl alcohol polyethylene glycol graft copolymers.

In the process for the production of flexographic printing plates by IR ablation, the quality of the IR-ablative layer is the crucial parameter for the quality of the flexographic printing plate and the economic efficiency of the process.

The IR-ablative layer must satisfy a number of widely varying quality criteria:

It should have high sensitivity to lasers in order to ensure rapid and complete removal of the layer with the lowest possible laser power.

It should be soluble in conventional wash-out agents for the photopolymerizable layer so that it can be removed together with the unpolymerized constituents of the layer during the conventional development step. Otherwise, two wash-out steps would have to be carried out.

The laser apparatuses used nowadays are usually instruments with rotating drums (external or internal drums). The IR-ablative layer must therefore be elastic in order that it does not tear or wrinkle on clamping onto the drums.

It must be tack-free in order that no dust is attracted which could interfere with the IR ablation.

For storage and transport, flexographic printing elements are usually protected against damage by means of a protective film, which has to be removed before the IR ablation. The protective film must have only low adhesion to the IR-ablative layer in order that the IR-ablative layer is not damaged on removal.

Conversely, the IR-ablative layer must adhere strongly to the light-sensitive layer in order that it is not removed at the same time on removal of the protective film and in order that no air bubbles nullify the advantage of direct contact between the IR-ablative layer and the photopolymerizable layer.

The person skilled in the art who would like to produce a high-sensitivity, high-quality flexographic printing element having an IR-ablative layer sees himself confronted with a typical catch 22 situation. In order to obtain an IR-ablative layer with the highest possible sensitivity, the use of a self-oxidative binder, such as nitrocellulose, is advisable. However, nitrocellulose layers are very brittle, and consequently the elasticity of nitrocellulose layers is unsatisfactory and flexographic printing elements of this type wrinkle easily on clamping onto drum instruments. Although the brittleness can be reduced by addition of suitable plasticizers, the addition of plasticizers frequently has the consequence, however, of tacky layers with excessive cover film adhesion. However, typical tack-free binders, such as certain polyamides, have significantly lower sensitivity.

None of the cited documents from the prior art contains an indication of which components have to be selected from the multiplicity of possible components in order to obtain a flexographic printing element which meets all the outlined requirements.

It is an object of the present invention to provide a flexographic printing element having an IR-ablative layer which does not have the disadvantages of the prior art and satisfies the abovementioned requirements.

Accordingly, a photosensitive flexographic printing element for the production of flexographic printing plates by digital imaging by means of lasers has been found which comprises at least a dimensionally stable support, a photopolymerizable layer, at least comprising an elastomeric binder, a polymerizable compound and a photoinitiator or photoinitiator system, a laser-ablatable layer having an optical density in the actinic spectral region of at least 2.5 and comprising at least one elastomeric binder and an IR absorber for laser radiation, and optionally a removable, flexible protective film, where the elastomeric binder of the IR-ablatable layer is an elastomeric polyether-polyurethane.

We have also found a process for the production of flexographic printing plates using an element of this type.

In detail, the following comments should be made regarding the invention.

In the photopolymerizable printing element according to the invention, a conventional photopolymerizable layer, if desired with an adhesion layer, is applied to a dimensionally stable support. Examples of suitably dimensionally stable supports are plates, films and conical and cylindrical tubes (sleeves) made from metals, such as steel or aluminum, or plastics, such as polyethylene terephthalate (PET) or polyethylene naphthalate (PEN).

The photopolymerizable layer consists of a negative-working photopolymerizable mixture, i.e. one which is cured by exposure. This can be carried out by photo-crosslinking with previously prepared polymers, by photopolymerization of low-molecular-weight, photopolymerizable compounds or both. Photopolymerizable layers essentially consist of a polymeric, elastomeric binder which can be washed out in the developer, an ethylenically unsaturated, free-radical-polymerizable compound, a photoinitiator or a photoinitiator system, and optionally further additives and auxiliaries. The composition of layers of this type is known in principle and is described, for example, in DE-A 24 56 439 or EP-A 084 851.

The elastomeric binder can be a single binder or a mixture of various binders. Examples of suitable binders are the known vinylaromatic-diene copolymers or block copolymers, for example conventional SIS or SBS block copolymers, diene-acrylonitrile copolymers, ethylene-propylene-diene copolymers or diene-acrylate-acrylic acid copolymers. Examples of suitable polymerizable compounds are conventional ethylenically unsaturated monomers, such as acrylates or methacrylates of mono- or polyfunctional alcohols, acrylamides or methacrylamides, vinyl ethers or vinyl esters. Examples include butyl (meth)acrylate, 2-ethylhexyl (meth)acrylate, butanediol di(meth)acrylate and hexanediol di(meth)acrylate. Suitable initiators for the photopolymerization are aromatic compounds, for example keto compounds, such as benzoin or benzoin derivatives.

The photopolymerizable mixtures may furthermore comprise conventional auxiliaries, for example inhibitors for thermally initiated polymerization, plasticizers, dyes, pigments, photochromic additives, antioxidants, antiozonants or extrusion aids.

The precise composition and thickness of the photopolymerizable layer is determined by the person skilled in the art depending on the particular requirements. It is also possible to employ a plurality of photopolymerizable layers of identical or different composition arranged one on top of the other. Furthermore, the element may comprise additional layers, for example adhesion layers, upper layers or elastic underlayers.

The photopolymerizable layers may be developable in aqueous or organic media, depending on the binder used. However, the advantages of the invention are particularly evident if the layer can be developed in organic media.

The element which is essential to the invention is the novel IR-ablative layer, which is applied to the photopolymerizable layer directly or also indirectly, i.e. separated by a thin interlayer, for example an adhesion or barrier layer. The IR-ablative layer is preferably applied directly to the photopolymerizable layer.

The IR-ablative layer comprises at least one elastomeric binder and an IR absorber for laser radiation and is essentially opaque to actinic radiation. In general, the optical density of the IR-ablative layer in the actinic spectral region is at least 2.5, preferably at least 3.0 and very particularly preferably at least 3.5. Said optical density is in each case measured at the wavelength or in the wavelength range employed for exposure of the element during the full-area irradiation.

The at least one elastomeric binder is a polyether-polyurethane. Suitable polyether-polyurethanes can be formed in a manner known in principle using difunctional polyethers which are capable of reaction with isocyanate groups, preferably polyether-diols. The difunctional polyethers are reacted with preferably symmetrical diisocyanates and short-chain, low-molecular-weight diols. This gives polymers which are built up from hard and soft segments and have elastomeric properties. Further details on the synthesis principle are given, for example, in "Polyurethanes, Chapter 4.3; Ullmann's Encyclopedia of Industrial Chemistry, Sixth Edition, 2000 Electronic Release".

Suitable polyether-diols for the synthesis of the polyether-polyurethanes have the general formula HO—(Z—O—)$_x$H. These may be homopolymers comprising identical Z groups or copolymers or block copolymers having different Z groups in one molecule. The Z groups are, in particular, divalent radicals derived from ethylene, propylene or butylene. The polyether-diols can be obtained in a manner known in principle by polymerization of ethylene oxide, propylene oxide or butylene oxide using compounds which have active H atoms available, for example water or alcohols. They can also be prepared by polymerization of cyclic ethers, for example THF. It is also possible to employ polyether-diols additionally containing small amounts of further chain units. Examples which may be mentioned are carbonate groups obtainable by reaction of polyalkylene oxides with phosgene. However, the amount of additional units of this type should generally not exceed 5 mol %, based on the total amount of chain units. Polyether-polyurethanes are commercially available.

The mean molecular weight $M_w$ (weight average) of the polyether-polyurethanes employed is usually from 20,000 to 200,000 g/mol, preferably from 20,000 to 150,000 g/mol and particularly preferably from 30,000 to 130,000 g/mol.

It is of course also possible to employ mixtures of two or more different polyether-polyurethanes.

The amount of polyether-polyurethanes in the IR-ablative layer is generally from greater than 40% by weight to a maximum of 90% by weight, based on the amount of all constituents of the IR-ablative layer, preferably from 45 to 80% by weight and very particularly preferably from 45 to 70% by weight.

The IR-ablative layer furthermore comprises a substance finely dispersed in the layer as absorber for laser radiation. This should have the highest possible absorption between 750 and 20,000 nm. Suitable substances as absorber include IR-absorbent dyes, for example phthalocyanines and phthalocyanine derivatives, merocyanines or methine dyes, and strongly colored inorganic pigments, for example carbon black, graphite, iron oxides or chromium oxides. Preference is given to carbon black. Besides the function as IR absorber, carbon black equally ensures that the IR-ablative layer is opaque to actinic radiation, meaning that it is not absolutely necessary additionally to employ a UV-absorbent dye. It is preferred to employ finely divided particles in order to obtain the highest possible tinting strength and the most uniform layer possible. Preference is given to finely divided carbon black grades, for example Printex® U, Printex® L6, Special Black 4 or Special Black 250 from Degussa.

The amount of absorber for the laser radiation is usually from 1 to 59.9% by weight, based on the sum of all constituents of the layer, preferably from 10 to 50% by weight and particularly preferably from 25 to 50% by weight.

The IR-ablative layer may additionally also comprise additional auxiliaries or additives. Examples of auxiliaries of this type are dispersion aids for pigments, fillers, plasticizers or coating aids. Auxiliaries or additives of this type are selected by the person skilled in the art depending on the desired properties of the layer, provided that they do not adversely affect the properties of the layer. Suitable dispersion aids for carbon blacks are, in particular, polyoxyalkylene derivatives, for example Solperse grades (Zeneca) or block copolymers, such as Disperbyk grades (Byk). It is also possible to employ UV absorbers as auxiliaries. This is usually not absolutely necessary in the case of the use of carbon black as absorber, but may occasionally be advantageous. On use of IR dyes as absorber, the use of additional UV absorbers is frequently unavoidable, although not absolutely necessary in each case. In general, the amount of all additives and auxiliaries should not exceed 20% by weight, preferably 10% by weight and very particularly preferably 5% by weight, based on the sum of all constituents of the IR-ablative layer.

All constituents of the IR-ablative layer should furthermore be selected in such a way that the IR-ablative layer is completely soluble or at least swellable in conventional organic developers for flexographic printing plates, so that the residues of the IR-ablative layer can be removed in a single operation together with the unpolymerized areas of the photopolymerizable layer. However, the invention is not restricted to this embodiment.

It is advisable to protect the IR-ablative flexographic printing element according to the invention against damage during transport, storage and handling by a flexible protective film, although a protective film of this type is not absolutely necessary.

The IR-ablative layer should be as thin as possible so that it can be removed as efficiently as possible by means of laser radiation. The thickness of the layer only has a lower limit insofar as the layer must have an optical density of at least 2.5. In general, a thickness of from 1 to 10 $\mu$m is appropriate, without the invention thus being limited to this range.

In a particularly advantageous embodiment, the IR-ablative layer, besides the polyether-polyurethane or the polyether-polyurethanes, comprises at least one further binder of a different chemical nature, which will be referred to below as the secondary binder. It is also possible to employ a plurality of different binders as secondary binder. The amount of the secondary binder is less than the amount of the principal binder polyether-polyurethane. The amount of a secondary binder of this type is usually from 0 to 40% by weight, preferably from 0 to 20% by weight and particularly preferably from 0 to 10% by weight, based on all constituents of the IR-ablative layer.

The secondary binder is selected by the person skilled in the art depending on the desired properties of the IR-ablative layer, provided that the properties of the layer are not aversely affected by the secondary binder.

Besides the polyether-polyurethane, particularly proven secondary binders are cellulose derivatives which can be obtained, for example, by esterification or etherification of cellulose. Examples of suitable cellulose derivatives include methylcellulose, ethylcellulose, hydroxyethylcellulose, hydroxypropylcellulose, cellulose acetate, cellulose acetylpropionate, cellulose acetylbutyrate, nitrocellulose or mixtures thereof. Both nitrocellulose and ethylcellulose have proven very particularly successful.

The photosensitive flexographic printing elements according to the invention can be produced by firstly applying the photopolymerizable layer and optionally further layers to the support, and subsequently applying the IR-ablative layer, for example by casting or lamination. To this end, firstly all constituents of the layer are dissolved or dispersed in a suitable solvent or solvent mixture with vigorous mixing. A solution or dispersion of this type can be applied directly to the photopolymerizable element and the solvent evaporated. However, the solution can also be cast onto a support film, for example a PET film, and the solvent evaporated. The coated support is then laminated onto the photopolymerizable layer under pressure and/or the influence of heat. The support for the IR-ablative layer then functions as protective film for the entire photopolymerizable printing element.

The photosensitive printing elements according to the invention with an IR-ablative layer are employed for the production of flexographic printing plates. If present, the protective film is firstly removed. The IR-ablative layer is then irradiated imagewise using a suitable laser in order to obtain a photographic mask. Examples of suitable IR lasers include Nd/YAG lasers (1064 nm) and diode lasers (for example 830 nm). Suitable laser systems for computer-to-plate technology are commercially available, for example the OmniSetter® diode laser system (Misomex, wavelength 830 nm; working width 1800 mm) or the digilas® Nd/YAG laser system (Schepers), each of which comprises a cylindrical drum, onto which the flexographic printing element with IR-ablative layer is mounted. The drum is subsequently set in rotation, and the element is imaged by means of the laser beam.

After writing the mask, the photosensitive element is exposed over the entire area to actinic light through the mask. This can advantageously be carried out directly on the laser cylinder. However, the plate can also be taken off and exposed in a conventional flat-bed exposure apparatus—in air, under nitrogen or in vacuo. During the exposure step, the layer is photochemically crosslinked in the areas uncovered by IR ablation in the preceding process step, while the areas still covered remain uncrosslinked.

In a further process step, the exposed element is developed. The development can in principle be carried out in commercially available developer apparatuses using commercially available organic wash-out agents for flexographic printing plates, for example nylosolv® or Optisol®. During the development, the unexposed areas of the photopolymerizable layer and the residues of the IR-ablative layer are removed. It is preferred to employ only a single wash-out agent for this process step. However, it is also possible firstly to remove the residues of the IR-ablative layer using a wash-out agent and subsequently to develop the plate in a second wash-out agent. After the development, the resultant flexographic printing plates are dried in a known manner. The process may comprise further process steps, for example detackifying with UV-C or $Br_2$.

The flexographic printing elements according to the invention with an IR-ablative layer have a number of advantages:

Although the sensitivity to laser radiation does not reach that of pure nitrocellulose layers, it is nevertheless higher than that of most commercially available plates. The layer surface is tack-free and the protective or cover film adhesion is low, enabling the protective film to be removed without problems. On the other hand, the adhesion to the photopolymerizable layer is sufficiently great so that the IR-ablative layer remains adhering to the photopolymerizable layer even on rapid and unintentional removal of the protective film. The layers can be washed off using conventional organic wash-out agents, such as nylosolv® The surprisingly high elasticity is particularly advantageous, enabling flexographic printing plates of this type to be laid around the drums of laser exposure units without problems, without the layer tearing or wrinkling.

The following examples are intended to explain the invention by way of example.

General procedure for the preparation of a dispersion of IR absorber and binder

The dispersion aid (Solsperse 20 000) is pre-dissolved in the solvent mixture. The binder(s) and any further additives are subsequently added and dissolved with stirring. The carbon black is then added slowly and dispersed in for 15 minutes at a dissolver speed of 5000 rpm. The resultant mixture is ground for 1 hour in a laboratory stirred ball mill. The dispersion has a solids content of 10% by weight, based on the sum of all constituents.

The dispersion is coated onto a PET film using a laboratory knife coater and dried at 60° C. for 10 minutes. The application rate is set so that a dry film with a thickness of about 2.5 $\mu$m is formed. The optical density of a film of this type in the spectral region of actinic light is from 3.0 to 3.5.

The protective film and substrate layer are removed from a commercial flexographic printing plate of the FAH 254 type (BASF), so that the surface of the photopolymerizable layer is uncovered. The film coated with the IR-ablative layer is dry-laminated onto the surface of the photopolymerizable layer so that the IR-ablative layer and the photopolymerizable layer are bonded to one another. The PET film forms the protective film. The plate is stored for 1 week at room temperature.

EXAMPLES 1–5

A polyether-polyurethane was employed as binder in each case, and in some experiments a 2nd binder was used. The amounts of the respective starting materials are shown in Table 1.

The cover film adhesion, the substrate adhesion, the elasticity and the tack of the IR-ablative layer of the resultant plates were determined. The measurement methods for the measurement parameters are shown in Table 3, and the results are shown in Table 2.

Comparative Examples C1–C5

Binders other than polyether-polyurethanes were employed. The amounts of the respective starting materials are shown in Table 1.

The cover film adhesion, the substrate adhesion, the elasticity and the tack of the IR-ablative layer of the resultant plates were determined. The measurement methods for the measurement parameters are shown in Table 3, and the results are shown in Table 2.

Laser imaging, conversion into a flexographic printing plate, general procedure.

The PET protective film is removed from the flexographic printing element with IR-ablative layer, and the plate is mounted onto the rotatable drum (diameter: 0.25 m) of an Nd/YAG laser system (Schepers, Ohio, digilas®). The drum is accelerated to 1600 rpm. The laser moves forward by 10 $\mu$m per drum rotation.

In a first experiment, firstly the minimum laser power necessary for complete removal of the IR-ablative layer at the points at which it is hit by the laser beam is determined for said drum speed and laser advance for each plate. The requisite laser power can be used to determine the sensitivity of the plate in $J/m^2$, i.e. the minimum energy per unit area which is necessary to remove the layer. The sensitivity is higher the lower the minimum energy.

In a further experiment, each plate is imaged digitally with the laser power determined. The photopolymerizable flexographic printing element obtained with digital mask is irradiated for 15 minutes with actinic light in a conventional manner and subsequently developed in a conventional manner in a brush washer using the commercial (organic) wash-out agent nylosolv® II. After the development, the plate is dried at 60° C. for 2 hours, irradiated with UV-C light for detackifying and finally post-crosslinked for 10 minutes with actinic light.

Examples 1–5 and Comparative Examples C1–C5

In each case, the flexographic printing elements produced were employed. The laser power determined in each case and the sensitivity are shown in Table 2. The ability of the IR-ablative layer to be washed off or removed in the wash-out agent was also determined. The results are shown in Table 2, and the measurement method is shown in Table 3.

Comparative Examples C6–C9

The mechanical properties, the sensitivity and the processing properties of 4 commercially available flexographic printing elements with IR-ablative layer were determined as outlined above. The results are likewise shown in Table 2.

TABLE 1

Compositions of the IR-ablative layers

| No. | Binder | Amount | Secondary binder | Amount | Laser absorber | Amount | Plasticizer | Amount | Solvent mixture |
|---|---|---|---|---|---|---|---|---|---|
| 1 | Polyether-polyurethane (Surkofilm 72 S, Mitchanol) | 62% | — | — | Carbon black | 35% | — | — | EtOH, EA, Bz (85:0.5:14.5) |
| 2 | Polyether-polyurethane (Elastollan E 1185, Elastogran) | 62% | — | — | Carbon black | 35% | — | — | EA, THF, MEK (76:6:18) |
| 3 | Polyether-polyurethane (Surkofilm 72 S) | 55.8% | Nitrocellulose E 950 | 6.2% | Carbon black | 35% | — | — | EtOH, Bz, EA (50:15:35) |

TABLE 1-continued

Compositions of the IR-ablative layers

| No. | Binder | Amout | Secondary binder | Amount | Laser absorber | Amount | Plasticizer | Amout | Solvent mixture |
|---|---|---|---|---|---|---|---|---|---|
| 4 | Polyether-polyurethane (Surkofilm 72 S) | 55.8% | Ethylcellulose ECT 50 (Hercules) | 6.2% | Carbon black | 35% | — | — | as 3 |
| 5 | Polyether-polyurethane (Surkofilm 72 S) | 55.8% | Ethylcellulose ECT 50 | 6.2% | Ebony Novacite ® | 35% | — | — | as 3 |
| C 1 | Nitrocellulose NC E 950 (Wolff Walsrode) | 52% | — | — | Carbon black | 35% | Plasthall 4141 (CP Hall) | 10% | T. PrOH, Bz; EA (1:3:1:1) |
| C 2 | Nitrocelulose NC E 1440 (Wolff Walsrode) | 52% | — | — | Carbon black | 35% | Plasthall 4141 | 10% | as C1 |
| C 3 | Polyester-polyurethane (Surkofilm PU 1147) | 62% | — | — | Carbon black | 35% | — | — | as 1 |
| C 4 | Polyester-polyurethane (Elastollan C 85 A) | 62% | — | — | Carbon black | 35% | — | — | as 2 |
| C 5 | Polyacrylate (Plexigum p 24, Rohm) | 62% | — | — | Carbon black | 35% | — | — | Bz/MEK/Ac (5:45:50) |

Amounts in each case given in % by weight, based on all constituents of the layer, with an additional 3% by weight of Solperse 2000 in all experiments as dispersion aid.

The solids:solvent ratio in the dispersion is 1:9

(Abbreviations: EtOH: ethanol, PrOH: 1-propanol, EA: ethyl acetate, Bz: benzyl alcohol, Ac: acetone, MEK: methyl ethyl ketone, T: toluene)

TABLE 2:

Test results

| No. | Product | Laser power [W] | Sensitivity [J/cm$^2$] | Tack-free | Substrate adhesion | Cover film adhesion | Elasticity | Ability to be washed off in Nylosolv II |
|---|---|---|---|---|---|---|---|---|
| 1 | Polyether-polyurethane Surkofilm 72 S | 3.8 | 1.9 | + | + | + | + | + |
| 2 | Polyether-polyurethane Elastollan E 1185 | 4.0 | 2.0 | + | + | (+) | + | (+) |
| 3 | Surkofilm 72 S with Nitrocellulose E 950 (9:1) | 3.5 | 1.7 | + | + | + | + | + |
| 4 | Surkofilm 72 S with Ethylcellulose ECT 50 (9:1) | 3.8 | 1.9 | + | + | + | + | + |
| 5 | As 4, but Ebony Novacite as laser absorber | 4.1 | 2.0 | + | + | + | + | + |
| C 1 | NC E 950/Plasthall | 1.8 | 0.8 | + | + | (−) | (+) | (+) |
| C 2 | NC E 1440/Plasthall | 1.9 | 0.9 | + | + | (−) | (+) | (−) |
| C 3 | Polyester-polyurethane Surkofilm PU 1147 | 3.8 | 1.9 | (+) | + | + | + | (−) |
| C 4 | Polyester-polyurethane Elastollan C 85 A | 4.0 | 2.1 | + | + | (−) | + | — |
| C 5 | Polyacrylate Plexigum P 24 commercial product | 4.6 | 2.2 | (−) | + | + | + | + |
| C 6 | Dupont Cyrel ® DPH | 5.0 | 2.4 | + | (+) | + | (+) | + |
| C 7 | Asahi AFP ® XDI | 4.3 | 2.1 | + | + | + | (+) | + |
| C 8 | BA5F digiflex ® I | 3.7 | 1.8 | + | (+) | + | (+) | — |
| C 9 | Polyfibron Flexlight ® CBU | 6.3 | 3.1 | + | + | + | (+) | + |

TABLE 3

Explanations of the assessments in Table 1

| Property/Assessment | + | (+) | (−) | − |
|---|---|---|---|---|
| Tack-free | Fully tack-free | Low tack | Slightly tacky | Highly tacky |
| Substrate adhesion | Very strong: substrate cannot be removed: >30 and very difficult to remove: 5–30 | Substrate difficult to remove: 2–5 | Substrate easy to remove: 0.3–2. | Weak, substrate very easy to remove: 0.1–0.2 |
| Cover film adhesion | Weak 0.01–0.08 | Normal 0.09–0.19 | Strong 0.2–0.5 | Too strong/very difficult to remove: >0.5 |

TABLE 3-continued

Explanations of the assessments in Table 1

| Property/Assessment | + | (+) | (−) | − |
|---|---|---|---|---|
| Elasticity | Does not tear and does not wrinkle even on severe bending inward and outward | Does not tear and does not wrinkle on external bending, but does on internal bending | Tears and wrinkles on external and internal bending | Tears easily and wrinkles on external and internal bending |
| Ability to be washed out in nylosolv ® II | Removed after 1st brush | Removed after 2nd brush | Removed after 3rd brush | Remains on the flexographic plate during the entire washing process |

Values for substrate adhesion and cover film adhesion in N/4 cm:
Measured on a 4 cm wide strip of the printing plate in a Zwick 1435 universal testing machine for stress/strain experiments.
Ability to be washed out: during standard wash-out operation in a nyloflex Combi L F II wash-out unit

We claim:

1. A photosensitive flexographic printing element for the production of flexographic printing plates for digital imaging by means of lasers, comprising at least a dimensionally stable support, a photopolymerizable layer, at least comprising an elastomeric binder, a polymerizable compound and a photoinitiator or photoinitiator system, a laser-ablatable layer having an optical density in the actinic spectral region of at least 2.5 and comprising at least one elastomeric binder and an IR absorber for laser radiation, and optionally a removable, flexible protective film, wherein the elastomeric binder of the laser-ablatable layer is an elastomeric polyether-polyurethane.

2. A photosensitive flexographic printing element as claimed in claim 1, wherein the amount of polyether-polyurethane in the laser-ablatable layer is from more than 40% by weight to a maximum of 90% by weight.

3. A photosensitive flexographic printing element as claimed in claim 1, wherein the laser-ablatable layer comprises at least one further binder which is different from the elastomeric polyether-polyurethane, where the amount of the at least one further binder is less than that of the polyether-polyurethane.

4. A photosensitive flexographic printing element as claimed in claim 3, wherein the further binder is a cellulose derivative.

5. A photosensitive flexographic printing element as claimed in claim 4, wherein the further binder is a cellulose derivative selected from the group consisting of methylcellulose, ethylcellulose, hydroxyethylcellulose, hydroxypropylcellulose, cellulose acetate, cellulose acetylpropionate, cellulose acetylbutyrate and nitrocellulose.

6. A photosensitive flexographic printing element as claimed in claim 3, wherein the laser-ablatable layer comprises 1–40% by weight of the further binder.

7. A photosensitive flexographic printing element as claimed in claim 1, wherein the IR absorber is carbon black.

8. A photosensitive flexographic printing element as claimed in claim 1, wherein the elastomeric polyether-polyurethane has a mean molecular weight $M_w$ of from 20,000 g/mol to 200,000 g/mol.

9. A process for the production of a flexographic printing plate in which the starting material employed is a photosensitive flexographic printing element as claimed in claim 1, comprising the following steps:

a) removal of the removable, flexible protective film, if present, b) writing of a mask into the IR-ablative layer by means of an IR laser, c) full area exposure of the photosensitive element to actinic light through the mask formed in step (b), d) treatment of the intermediate formed in (c) with at least one developer solution, during which the residues of the IR-ablative layer which have not been removed in step (b) are removed and the exposed photopolymerizable layer is developed.

10. A process as claimed in claim 9, wherein step (b) is carried out using a laser apparatus having a rotating drum, and the flexographic printing element is mounted on this drum for ablation.

* * * * *